US012675618B1

(12) United States Patent
Alt et al.

(10) Patent No.: US 12,675,618 B1
(45) Date of Patent: Jul. 7, 2026

(54) CLOUD TO BARE METAL CORRELATION FOR PERFORMANCE ESTIMATION AND PREDICTION

(71) Applicant: Advanced Micro Devices, Inc., Santa Clara, CA (US)

(72) Inventors: Max Alt, San Francisco, CA (US); Gabriel Martin, Quintana De La Sirena (ES)

(73) Assignee: Advanced Micro Devices, Inc., Santa Clara, CA (US)

( * ) Notice: Subject to any disclaimer, the term of this patent is extended or adjusted under 35 U.S.C. 154(b) by 1292 days.

(21) Appl. No.: 17/393,730

(22) Filed: Aug. 4, 2021

Related U.S. Application Data

(60) Provisional application No. 63/061,134, filed on Aug. 4, 2020.

(51) Int. Cl.
*G06F 30/20* (2020.01)
*G06F 17/16* (2006.01)
(Continued)

(52) U.S. Cl.
CPC .............. *G06F 30/20* (2020.01); *G06F 17/16* (2013.01); *H04L 41/0806* (2013.01);
(Continued)

(58) Field of Classification Search
CPC .......... G06F 30/20; G06F 30/25; G06F 30/27; G06F 30/28; G06F 17/16; G06F 8/60;
(Continued)

(56) References Cited

U.S. PATENT DOCUMENTS

| | | | |
|---|---|---|---|
| 8,296,419 | B1 | 10/2012 | Khanna et al. |
| 10,817,401 | B1 | 10/2020 | Lewis |

(Continued)

FOREIGN PATENT DOCUMENTS

| | | |
|---|---|---|
| EP | 8286177 | 10/2012 |

OTHER PUBLICATIONS

Ahmed, Maruf, and Albert Y. Zomaya. "The Effect of Resource Allocation and System Events on VM Consolidation." 2017 IEEE International Conference on Cluster Computing (CLUSTER). IEEE, 2017. (Year: 2017).*

(Continued)

*Primary Examiner* — Michael Edward Cocchi
(74) *Attorney, Agent, or Firm* — Fishman Stewart PLLC

(57) ABSTRACT

Systems and methods for correlating performance on bare metal systems with virtualized instances such as those commonly used in cloud computing systems are disclosed. Performance data may be collected from different bare metal and cloud instances. The performance data may be used to predict the performance of an application on another system, even if the particular performance counter of interest is unavailable on the system. Using measured and estimated performance counters (e.g., instructions counters), multiple measured and unmeasured but predicted instances can be compared and sorted to assist the user in making an informed decision when selecting where to run their instance and what configuration to use.

21 Claims, 7 Drawing Sheets

(51) Int. Cl.

| | | |
|---|---|---|
| *H04L 41/0806* | (2022.01) | |
| *H04L 41/50* | (2022.01) | |
| *H04L 41/5054* | (2022.01) | |
| *H04L 67/10* | (2022.01) | |

(52) U.S. Cl.
CPC .......... *H04L 67/10* (2013.01); *H04L 41/5054* (2013.01); *H04L 41/5096* (2013.01)

(58) Field of Classification Search
CPC . H04L 41/0806; H04L 67/10; H04L 41/5054; H04L 41/5096
See application file for complete search history.

(56) References Cited

U.S. PATENT DOCUMENTS

| | | | |
|---|---|---|---|
| 2011/0225299 A1* | 9/2011 | Nathuji ............... G06F 9/45558 718/1 |
| 2012/0131594 A1* | 5/2012 | Morgan ............... G06F 9/5072 718/105 |
| 2012/0226788 A1 | 9/2012 | Jackson |
| 2014/0089917 A1* | 3/2014 | Attalla .................. G06F 9/5083 718/1 |
| 2016/0019636 A1 | 1/2016 | Adapalli et al. |
| 2016/0098334 A1 | 4/2016 | Hariharakrishnan et al. |
| 2016/0224898 A1 | 8/2016 | Ryckbosch et al. |
| 2017/0005864 A1* | 1/2017 | Liu ..................... H04L 41/5054 |
| 2017/0249192 A1 | 8/2017 | Thompson |
| 2017/0373940 A1 | 12/2017 | Shahab et al. |
| 2018/0365576 A1* | 12/2018 | Guttmann .............. G06N 20/00 |
| 2019/0171483 A1* | 6/2019 | Santhar ................ G06F 9/4881 |
| 2019/0208009 A1 | 7/2019 | Prabhakaran et al. |

OTHER PUBLICATIONS

Zhang, Qi, Ludmila Cherkasova, and Evgenia Smirni. "A regression-based analytic model for dynamic resource provisioning of multi-tier applications." Fourth International Conference on Autonomic Computing (ICAC'07). IEEE, 2007. (Year: 2007).*
International Search Report and Written Opinion for International Patent Application No. PCT/US21/42439.

* cited by examiner

1

CLOUD TO BARE METAL CORRELATION FOR PERFORMANCE ESTIMATION AND PREDICTION

CROSS-REFERENCE TO RELATED APPLICATIONS

This application claims the benefit of, and priority to, U.S. Provisional Application Ser. No. 63/061,134, filed Aug. 4, 2020, the disclosure of which is hereby incorporated herein by reference in its entirety and for all purposes.

TECHNICAL FIELD

The present disclosure generally relates to the field of computing and, more particularly, to systems and methods for estimating and predicting application performance in computing systems.

BACKGROUND

This background description is set forth below for the purpose of providing context only. Therefore, any aspect of this background description, to the extent that it does not otherwise qualify as prior art, is neither expressly nor impliedly admitted as prior art against the instant disclosure.

Most cloud computing solutions are based on virtualization technology, which enables multiple applications or workloads to share the same physical computing resources (e.g. a server) while remaining safely isolated from one another. This ability is a key to enabling cost-effective cloud computing and allows users of cloud computing to design virtual systems with a desired number of virtual processors and access to a specific amount of memory and storage. Virtualization may add some processing overhead, and it also makes performance modeling more difficult due to potential inconsistencies (e.g., impact of other virtual machines, or different runs being assigned to different physical machines). For high performance workloads such as artificial intelligence, scientific simulation, and graphics processing, performance is particularly important. Typically, performance is measured by running one or more known test applications (e.g. benchmarks) and profiling the system using CPU performance counters to gather performance-related event data such as instructions per second, cache-misses, clock cycles, branch misses, etc. However, many cloud computing services (particularly public clouds) do not expose CPU events such as these to guest systems (e.g., customer applications running in the cloud's virtualized environment). This is typically due to security concerns, as maintaining the isolation of each guest system is easier when they are not provided access to the physical hardware they are running on. Unfortunately, without access to CPU performance counters, it is difficult or impossible to measure these events with traditional profiling tools (e.g., the commonly used Linux performance tool called "perf").

Without being able to run these traditional performance measuring tools, many creators of high-performance workloads (e.g., data scientist) are left to guess at what the best virtual system configuration is for each of their applications (e.g., how many virtual processors are needed, and how much memory should be allocated). As costs for using cloud computing goes up significantly as more virtual resources are allocated, this uncertainty can have a significant financial impact. If too few resources are allocated, the user's application may take too long to execute (e.g., days instead of hours). If too many are allocated, the user may not be able to afford to run the application or run the application as often as desired. A common workflow for users is to create an application using on-premises bare metal systems (e.g., a workstation or server) and test it with small data sets. Once their application is ready, they migrate it to the cloud to run with full datasets on a large virtual system with many more processors than they have access to on their on-premises systems. But a virtual processor rarely performs the same as a bare-metal processor, and without easy access to performance comparisons, these users must guess and risk either overpaying for resources they do not need or missing deadlines as they wait longer than needed for their application to complete. For at least these reasons, an improved method for cloud versus bare metal performance estimation and prediction is needed.

SUMMARY

On public clouds there are different types of instances available. Depending on their hardware characteristics, some of them allow access to many performance counters, while others only allow access to a very limited set of performance counters due to security concerns as noted above. Using the methods described herein, it is possible to (i) build a training set by gathering multiple performance counters from multiple bare metal and cloud instances in which they are available, (ii) create a regression model trained with that gathered performance data, and then (iii) infer the instructions counter for a new cloud instance (i.e., one that does not provide access to the desired performance counters, such as in a restricted shared instance on a public cloud) using the regression model based on a small subset of counters that are widely available, even on restricted public cloud instances. This may be used to recommend a cloud configuration matching a user's existing bare metal system, display relative performance between different cloud instances on different clouds, and or compare performance between an existing cloud instance or configuration and a proposed bare metal system.

By collecting performance data from many different instances (e.g. on bare metal and cloud instances), a prediction/estimation of performance of an application instance on another system (e.g., bare-metal or cloud) can be made. The systems and methods contemplated enable comparisons between different bare metal and cloud instances (including different configurations). For example, a performance comparison for a new application can be made by matching the application to previously measured applications and then using data from that previous application to compare predicted performance of the new application on a first bare-metal instance to a second different bare-metal instance, a first cloud instance to a second different cloud instance, a first bare-metal instance to a second cloud instance (or vice versa). By using measured and estimated performance counters (e.g., instructions counters), multiple measured and unmeasured but predicted instances can be compared and sorted to assist the user in making an informed decision when selecting where to run their instance and what configuration to use.

Accessible counters on virtualized cloud instances such as task-clock, context-switches and page-faults may be used to build a machine learning system to estimate an instructions counter which is not available in those cloud instances. The correlations between the accessible counters and the desired but inaccessible counters are preferably linear and positive in order to enables more successful prediction. Using positively and linearly correlated counters enable estimated instructions counters that are useful to users in comparing performance between cloud instances and bare metal instances. Test data indicates that the relationship between the instructions counter and the other more widely available counters (e.g., cycles, page-faults, and context-switches) is generally linear and positive for many applications, i.e., the more instructions the more cycles, context switches and page faults. A non-linear or negative relationship between one of those counters may indicate that for a particular application the counter may not be related with instructions and therefore should not be used for estimates involving that particular application.

In some embodiments, the method for estimating performance on cloud computing systems may comprise executing performance benchmarks on cloud computing systems and bare metal computing systems to collect performance counter data (e.g., normally available counters and normally unavailable counters). A model for each of the performance benchmarks may be created based on an observed relationship between the normally available counters and the normally unavailable counters in the collected performance counter data. An application to be modeled may be matched with one of the performance benchmarks, and at least one of the one or more unavailable performance counters for the application may be predicted based on the matched performance benchmark. The predicted and previously unavailable performance counters may be used for example to make configuration recommendations (e.g., cloud instance configurations such as the number of processors, amount of memory, etc.) or performance predictions to the user for their application.

In some embodiments, a matrix may be used and populated based on collected performance counter data, and the model for each of the performance benchmarks used may be a vector. The matrix may then be updated with additional data gathered from executing applications on one or more of the cloud computing systems. The matrix may be configured with columns that store values for performance counters such as instruction cycles, page-faults, and context-switches.

The methods described above may for example be implemented as computer-executable instructions stored on a computer-readable non-transitory medium (e.g., DVD-ROM, hard disk, SSD, flash drive).

A system for estimating cloud performance is also contemplated. In one embodiment, the system comprises different modules, including for example a tester (e.g., a test module) configured to gather performance counter data from test runs of a plurality of performance benchmarks on a plurality of cloud computing systems and bare metal systems. The performance counter data comprises a set of normally available counters and one or more normally unavailable counters. The gathered data set may for example be a large enough set of performance data observations in order to train a machine learning regression system. A model creator (e.g., model creation module) may be configured to create a model for each of the benchmarks based on the observed relationship between the normally available counters and the normally unavailable counters in the collected performance counter data. A matcher (e.g., matching module) may be configured to match an application to be modeled with one of the performance benchmarks; and a predictor (e.g., prediction module) may be configured to predict the unavailable performance counter for the application based on the matched performance benchmark's model.

The foregoing and other aspects, features, details, utilities, and/or advantages of embodiments of the present disclosure will be apparent from reading the following description, and from reviewing the accompanying drawings.

DETAILED DESCRIPTION

Reference will now be made in detail to embodiments of the present disclosure, examples of which are described herein and illustrated in the accompanying drawings. While the present disclosure will be described in conjunction with embodiments and/or examples, it will be understood that they do not limit the present disclosure to these embodiments and/or examples. On the contrary, the present disclosure covers alternatives, modifications, and equivalents.

Various embodiments are described herein for various apparatuses, systems, and/or methods. Numerous specific details are set forth to provide a thorough understanding of the overall structure, function, manufacture, and use of the embodiments as described in the specification and illustrated in the accompanying drawings. It will be understood by those skilled in the art, however, that the embodiments may be practiced without such specific details. In other instances, well-known operations, components, and elements have not been described in detail so as not to obscure the embodiments described in the specification. Those of ordinary skill in the art will understand that the embodiments described and illustrated herein are non-limiting examples, and thus it can be appreciated that the specific structural and functional details disclosed herein may be representative and do not necessarily limit the scope of the embodiments.

Figure 1:
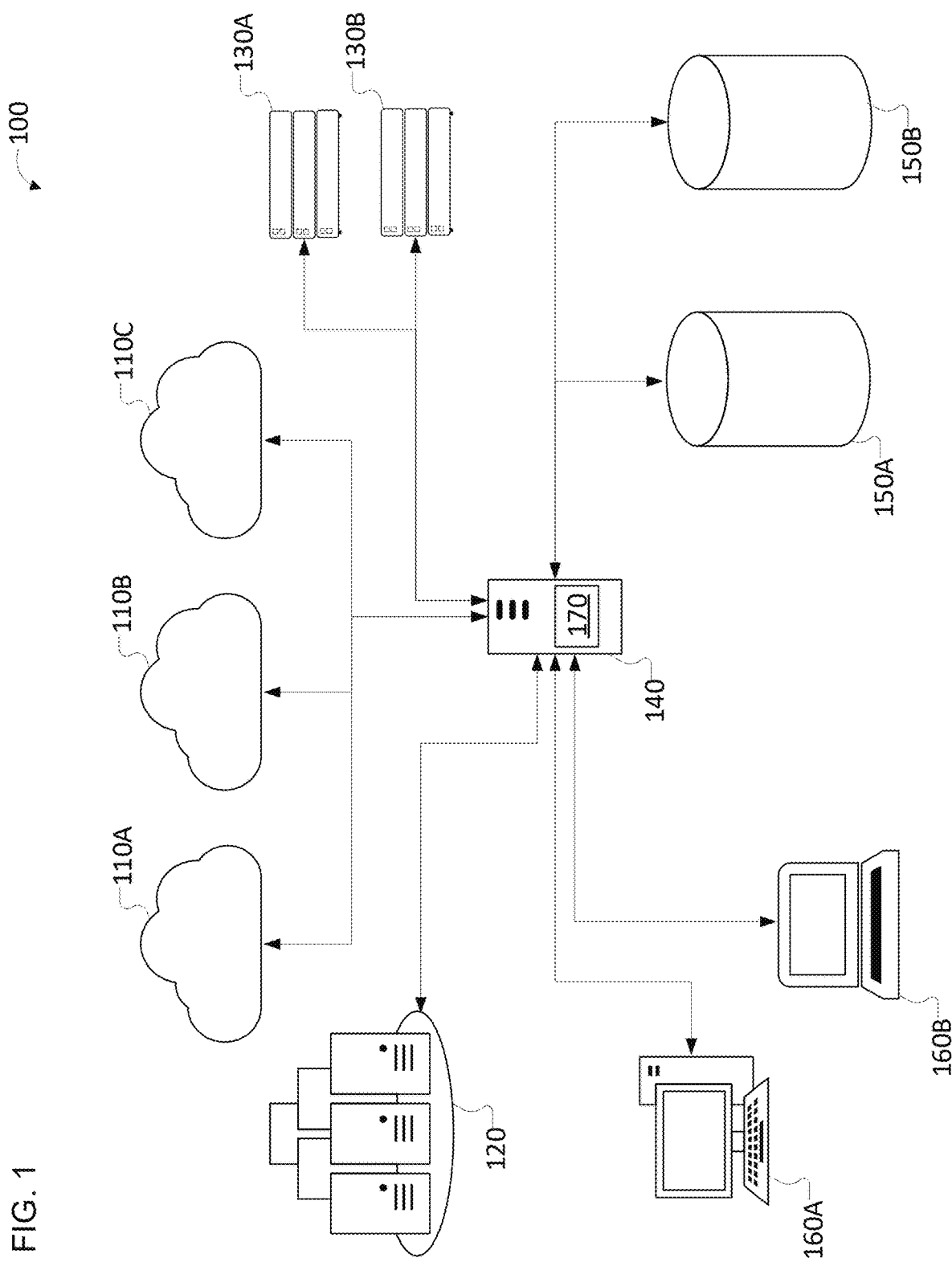
FIG. 1 is an illustration of one example of a distributed computing system.

Turning now to FIG. 1, an example of a distributed computing system 100 is shown. In this example, the distributed computing system 100 is managed by a management server 140, which may for example provide access to the distributed computing system 100 by providing a platform as a service (PAAS), infrastructure as a service (IAAS), or software as a service (SAAS) to users. Users may access these PAAS/IAAS/SAAS services from their on-premises network-connected user devices 160A-B such as PCs, workstations, servers, laptops or mobile devices via a web interface.

Management server 140 is connected to a number of different computing devices via local or wide area network connections. This may include, for example, cloud computing providers 110A, 110B, and 110C. These cloud computing providers may provide access to large numbers of computing devices (often virtualized) with different configurations. For example, systems with one or more virtual CPUs may be offered in standard configurations with pre-determined amounts of accompanying memory and storage. In addition to cloud computing providers 110A, 110B, and 110C, management server 140 may also be configured to communicate with bare metal computing devices 130A and 130B (e.g., non-virtualized servers), as well as a data center 120 including for example one or more high performance computing (HPC) systems (e.g., each having multiple nodes organized into clusters, with each node having multiple processors and memory), and storage systems 150A and 150B. Bare metal computing devices 130A and 130B may for example include workstations or servers optimized for machine learning computations and may be configured with multiple CPUs and GPUs and large amounts of memory. Storage systems 150A and 150B may include storage that is local to management server 140 as well as remotely located storage accessible through a network such as the internet. Storage systems 150A and 150B may comprise storage servers and network-attached storage systems with non-volatile memory (e.g., flash storage), hard disks, and even tape storage.

Management server 140 is configured to run a distributed computing management application 170 that receives jobs and manages the allocation of resources from distributed computing system 100 to run them. Management application 170 is preferably implemented in software (e.g., instructions stored on a non-volatile storage medium such as a hard disk, flash drive, or DVD-ROM), but hardware implementations are possible. Software implementations of management application 170 may be written in one or more programming languages or combinations thereof, including low-level or high-level languages, with examples including Java, Ruby, JavaScript, Python, C, C++, C#, or Rust. The program code may execute entirely on the management server 140, partly on management server 140 and partly on other computing devices in distributed computing system 100.

The management application 170 provides an interface to users (e.g., via a web application, portal, API server or command line interface) that permits users and administrators to submit applications/jobs via their user devices 160A-B, designate the data sources to be used by the application, designate a destination for the results of the application, and set one or more application requirements (e.g., parameters such as how many processors to use, how much memory to use, cost limits, application priority, etc.). The interface may also permit the user to select one or more system configurations to be used to run the application. This may include selecting a particular bare metal or cloud configuration (e.g., use cloud A with 24 processors and 512 GB of RAM).

Management server 140 may for example be a traditional PC or server, a specialized appliance, or one or more nodes within a cluster. Management server 140 may for example be configured with one or more processors, volatile memory, and non-volatile memory such as flash storage or internal or external hard disk (e.g., network attached storage accessible to management server 140).

Management application 170 may also be configured to receive computing jobs from user devices 160A-B, determine which of the distributed computing system 100 computing resources are available to complete those jobs, make recommendations on which available resources best meet the user's requirements, allocate resources to each job, and then bind and dispatch the job to those allocated resources. In one embodiment, the jobs may be applications operating within containers (e.g. Kubernetes with Docker containers) or virtualized machines.

Unlike prior systems, management application 170 may be configured to provide users with information about the predicted relative performance of different configurations in clouds 110A-C and bare metal systems in data center 120 and systems 130A-B. These predictions may be based on information about the specific application the user is planning to execute. In some embodiments the management application 170 may make recommendations for which configurations (e.g., number of processors, amount of memory, amount of storage) best match a known configuration from the user or which bare metal configurations best match a particular cloud configuration.

Figure 2:
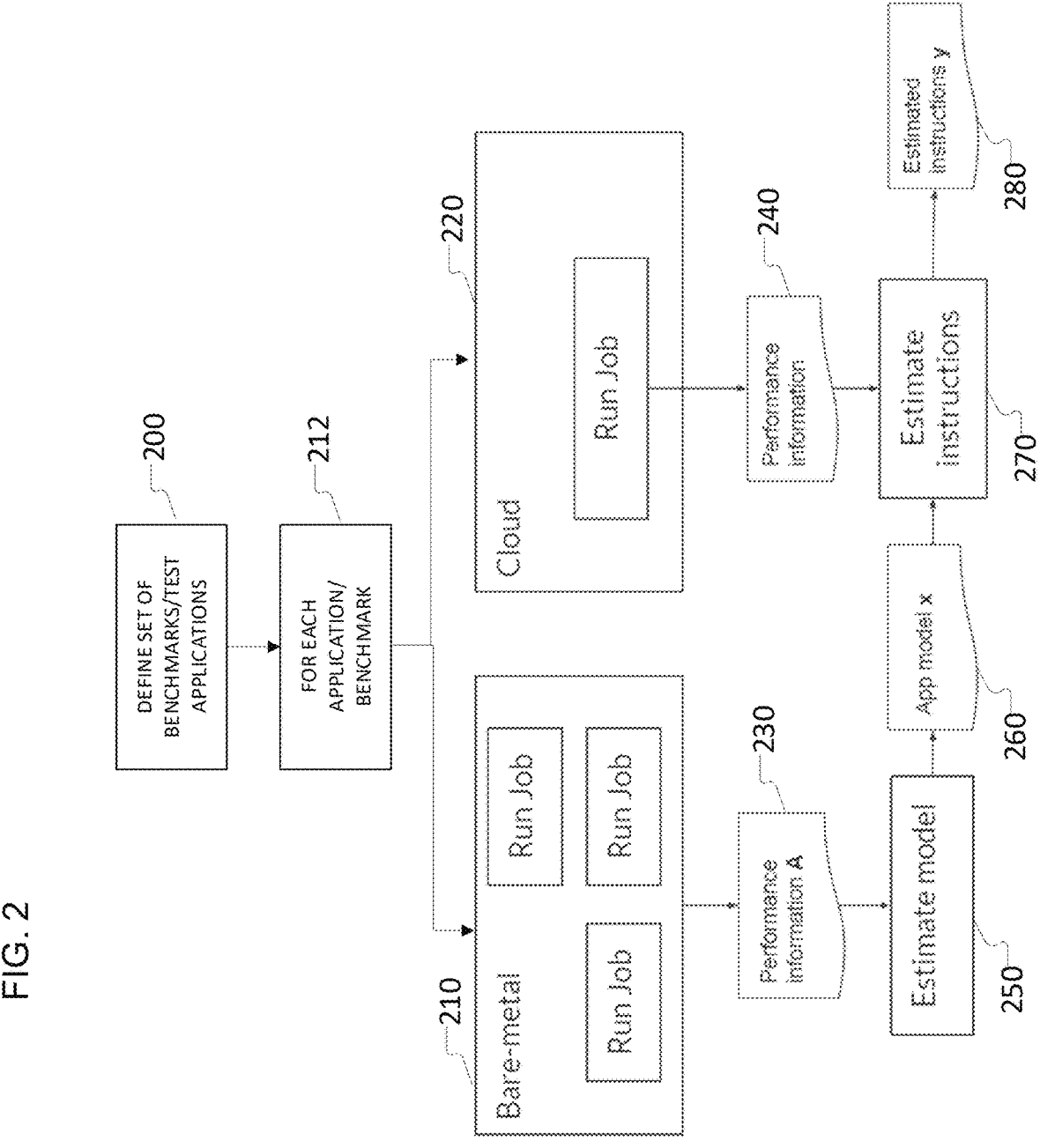
FIG. 2 is a flowchart of an example embodiment of a method for estimating application performance on cloud computing systems.

Turning now to FIG. 2, one example of a method for determining relative performance in cloud computing systems that may be implemented in the management application is shown. As noted above, one of the main metrics for performance estimation is instructions per second. In order to measure instructions per second, one needs to count instruction events in the hardware. Due to security constraints, most of the instance configurations available on cloud services do not allow the user to measure hardware events such as instructions executed, cache-misses, branch-misses, etc. However, there are some other events that are typically available, e.g., task-clock, page-faults, and context-switches. Other performance-related metrics that are also typically available include CPU usage, memory usage, disk usage, and network usage.

Testing has shown that a correlation exists between hardware events such as instructions executed and these other system metrics/events available in the cloud. Based on such correlation, estimations of instructions per second can be determined. For example, machine learning-based methods can be used to estimate performance events from the available system metrics.

In FIG. 2, one example of a method for estimating performance in cloud computing systems is shown. First, a set of benchmarks are defined (step 200). For example, a set of benchmarks might include parsec benchmarks, Tensorflow bird classifier, Graph500, Linpack, and xhpcg. These benchmarks may also include actual user applications. The benchmarks may be single node or multinode. Each benchmark is then run (step 212), preferably multiple times, on different instance types. This includes bare metal instances (step 210) and non-metal cloud instances (step 220). The total number of runs may be large, as some cloud providers offer more than 200 different instance types including non-bare metal and bare metal instances. For example, each benchmark may be run on a cloud provider on instances having: 2 processors with minimum RAM, 2 processors with maximum RAM, 4 processors with minimum RAM, 4 processors with maximum RAM, 8 processors with minimum RAM, etc. Performance data gathered from these benchmark runs on bare-metal instances (step 230) and cloud instances (step 240) is gathered and used to find one or more correlations between the hardware events and other system metrics or software events that are available on cloud instances (step 240). These correlations can be used to calculate an estimated model (step 250) for each application 260. Then data from runs on cloud instances (step 240) can be used to train a machine learning system (step 270), which can then be used to estimate hardware counter events 280 for applications on systems where these counter events are not accessible.

The benchmarks may be repeated a number of times (e.g., 5×) to increase the amount of data collected. A Pearson correlation coefficient may be calculated for all counters and system metrics. The counters that are significantly correlated with hardware events (both in general and for particular applications) may then be used to estimate the unavailable performance counter.

Some performance software events may be correlated with instructions (e.g., task-clock, page-faults, and context-switches), while others such as cache-misses may not correlate. Some correlations may be application dependent, so having a large number of benchmarks may improve the accuracy of predictions. While the correlations between counters may not be the same for all applications, some general patterns may be applicable.

Based on test data, bare metal to cloud performance may be estimated based on an instructions counter. As noted above, an instructions counter is a useful performance measure available in bare metal systems that indicates how many instructions the processor has executed. Together with time stamps, this yields an instructions per second value that generally results in a good measure of system performance and can be used across systems to compare relative performance. The higher the instructions counter (i.e., the instructions per second), the higher the performance. Since the instructions counter is generally not available in virtualized environments on a cloud, the instructions counter for virtualized cloud environments is predicted based on other counters typically available in those clouds.

To enable this prediction, a set of counters are measured on bare-metal (or metal instances on clouds which are configured to provide access to an instructions performance counter), and the collected data is used to build a machine learning (ML) regression system that estimates the instructions performance measure for other cloud instances (e.g., public clouds) based on a small subset of performance counters available on those cloud instances. Regression is a type of machine learning problem in which a system attempts to infer the value of an unknown variable (Y) from the observation of other variables that are related to the one the system is trying to infer (X). In machine learning regression systems, a sample data set (called a training set) is used. The training set is a set of samples in which the values for both the variable that is trying to be inferred (Y) and those variables that are related to that (X) are known. With the training set, the machine learning system learns a function or model (f) that relates or maps the values from X to Y (e.g., Y=f(X)). Once the function that maps the variables X with Y has been learned, then it is possible to infer the values of the variable Y from the observations of X.

The set of benchmarks used may for example be representative of many different types of applications. For example, in one embodiment multiple benchmarks from the following example list are utilized: Parsec benchmarks (e.g., blackscholes, bodytrack, facesim, freqmine, swaptions, vips, dedup, fluidanimate, x264, canneal, ferret, streamcluster), Tensor flow bird classifier, Linpak, graph500; and xhpcg. Other benchmarks and test applications are also possible and contemplated.

While many tools and techniques may be used to collect the performance data, one example is the perf stat tool, which is able to gather counter values at specified time intervals. The selected set of benchmarks may be executed with the perf stat tool running. This may be performed in multiple different cloud instances that are to be evaluated. Typically, cloud instances in cloud computing services are arranged by instance type and size (e.g. number of cores). If the instance type is large enough to fill the underlying hardware server (e.g., in AWS these instances are described as "metal"), then the security restrictions that prevent gathering performance counters are relaxed. This makes it possible to gather more performance counters on those instances as opposed to the severely limited set available in shared instances. In building the training set for the system, it may be desirable to run the selected set of benchmarks on at least some of the cloud instances that permit access to the larger set of performance counters.

Test data indicates that the instructions performance counter is highly related to other counters that are usually available, e.g., cycles, page-faults, and context-switches. As the relationship between them can be application specific, in one embodiment the system is configured to determine the relationship between the accessible counters and the desired but inaccessible instruction counter on a per benchmark (i.e., per application) basis. These measured relationships can then be used to predict the instructions counter on shared instances in public cloud systems where the instructions counter is not available.

While in some embodiments benchmarks may be combined to provide overall system-level relative performance rankings, for application-specific recommendations it may be preferable to model each benchmark separately, e.g., for each of the benchmarks a different x vector is calculated to model the relationship between the available counters and the unavailable but desirable instructions counter. To predict the instructions counter on a cloud with limited access to performance counters, the application for which the estimate is being performed is matched to one of the available benchmarks having been previously run. The learned model from that benchmark is then used to predict an estimated instruction counter (e.g. as y=Ax). In order to match applications, it is preferable to conduct at least one run with all performance counters available for that application. From that run, a normalized histogram of performance counters can be created. The normalized histograms may be computed from the quotient of different counters and may be normalized, such that concatenating all the histograms for a given application/benchmark provides a feature vector (i.e., a performance counters spectral signature) that can be used to perform application matching.

Figure 3:
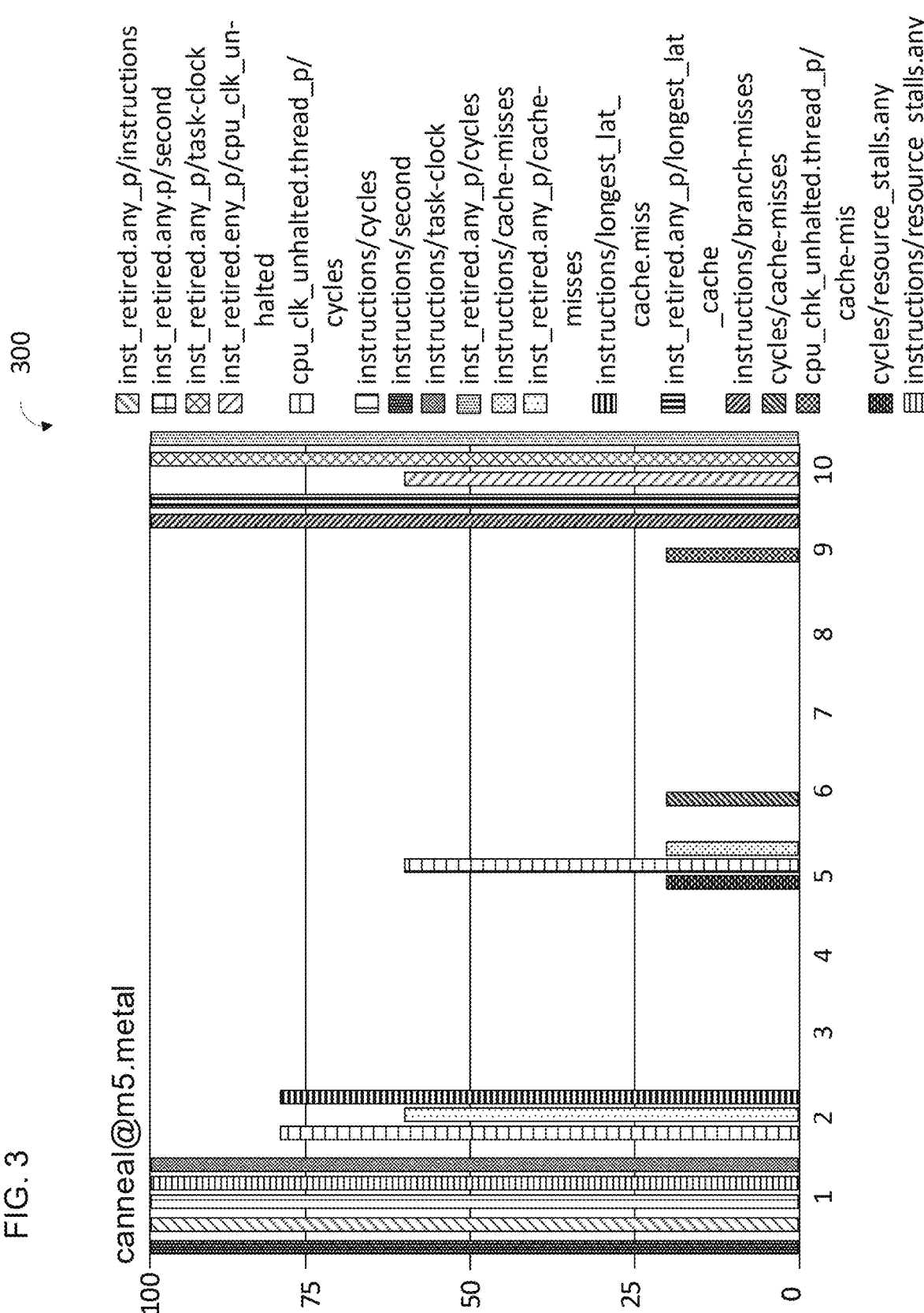
FIG. 3 is an illustration of an example histogram of performance counter data.

One such example histogram 300 is shown in FIG. 3, which is based on test data for the canneal benchmark on a full server "metal" cloud instance. These histograms may be used in matching a user's application to one of the tested benchmarks. To perform the application to benchmark matching, in one embodiment a metric to measure differences (e.g., distances) between applications may be used (e.g. least squares), and the benchmark closest to the user's application may be used.

Figure 4:
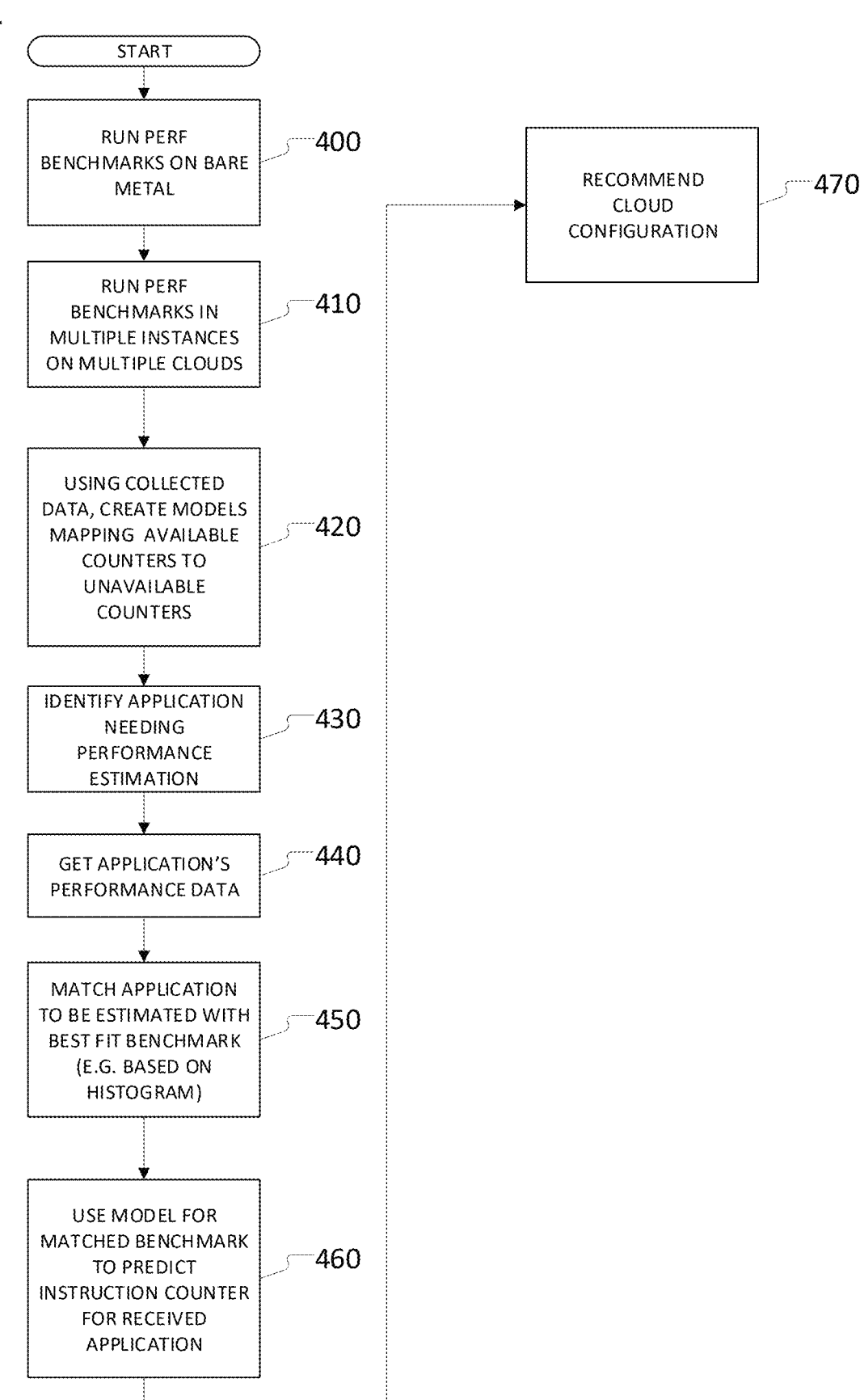
FIG. 4 is a flowchart of an example embodiment of a method for recommending a cloud configuration based on estimated performance counters.

Turning now to FIG. 4, a flowchart of an example embodiment of a method for recommending a cloud configuration based on estimated performance counters is shown. In this embodiment, benchmarks are run on bare metal systems (step 400) and on multiple cloud instances on multiple different clouds (step 410). Data is collected and used to create models that map available counters on cloud systems to the desired but unavailable performance counters such as the instructions counter (step 420). When a user specifies an application that they have previously run on bare metal and want to run on the cloud (step 430), the user is prompted for performance data the user has observed on the bare metal run (step 440). For example, the user may specify what the perf tool measured as instructions per second when they ran their application on their local development workstation on a test data set. The application may also be matched to one of the existing benchmarks that have been run (step 450). This matching may be based on application histograms, the libraries used by the application, the data sets used by the application, or other application-specific data or metadata. The model created earlier for the matching benchmark is then used to predict cloud performance counters for the application (step 460), and a recommendation is made (step 470). The recommendation may be for the fastest performance (e.g., within a given budget specified by the user), or for a best match to their current bare metal system's performance.

Figure 5:
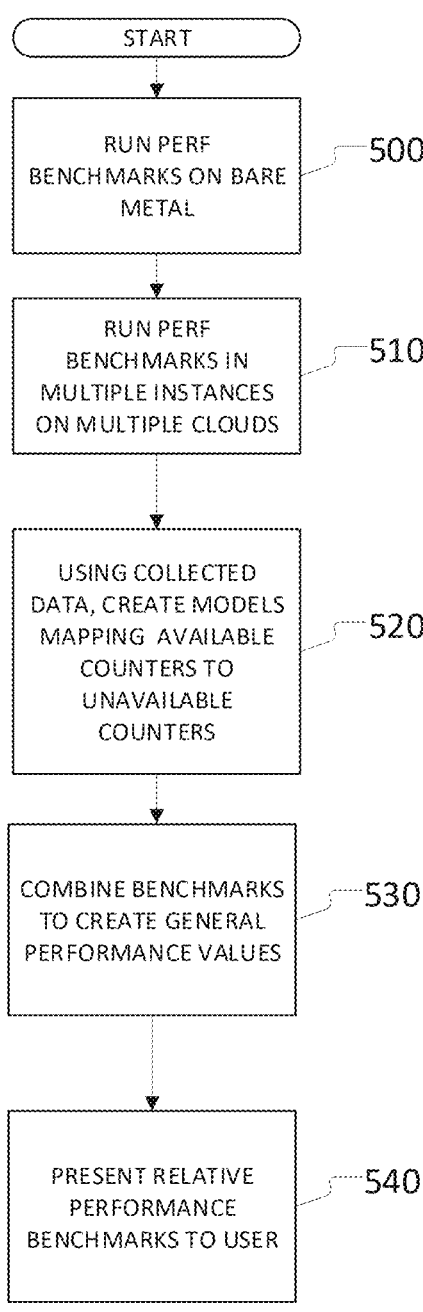
FIG. 5 is a flowchart of an example embodiment of a method for estimating relative cloud system performance.

Turning now to FIG. 5, a similar method may be used to provide general relative performance measures to users separate from a particular application. In this example embodiment, benchmarks are run on bare metal systems (step 500) and on multiple cloud instances on multiple different clouds (step 510). Data is collected and used to create models that map available counters on cloud systems to the desired but unavailable performance counters such as the instructions counter (step 520). These benchmark-specific values may then be combined (e.g., averaged) to generate overall relative performance values for each cloud configuration (step 530). These may then be presented to users (step 540), e.g., in a ranking system based on estimated instructions per second, to help them make informed decisions regarding which cloud and cloud instance configuration best fits their performance needs (e.g., when moving from one cloud instance to a different cloud).

Figure 6:
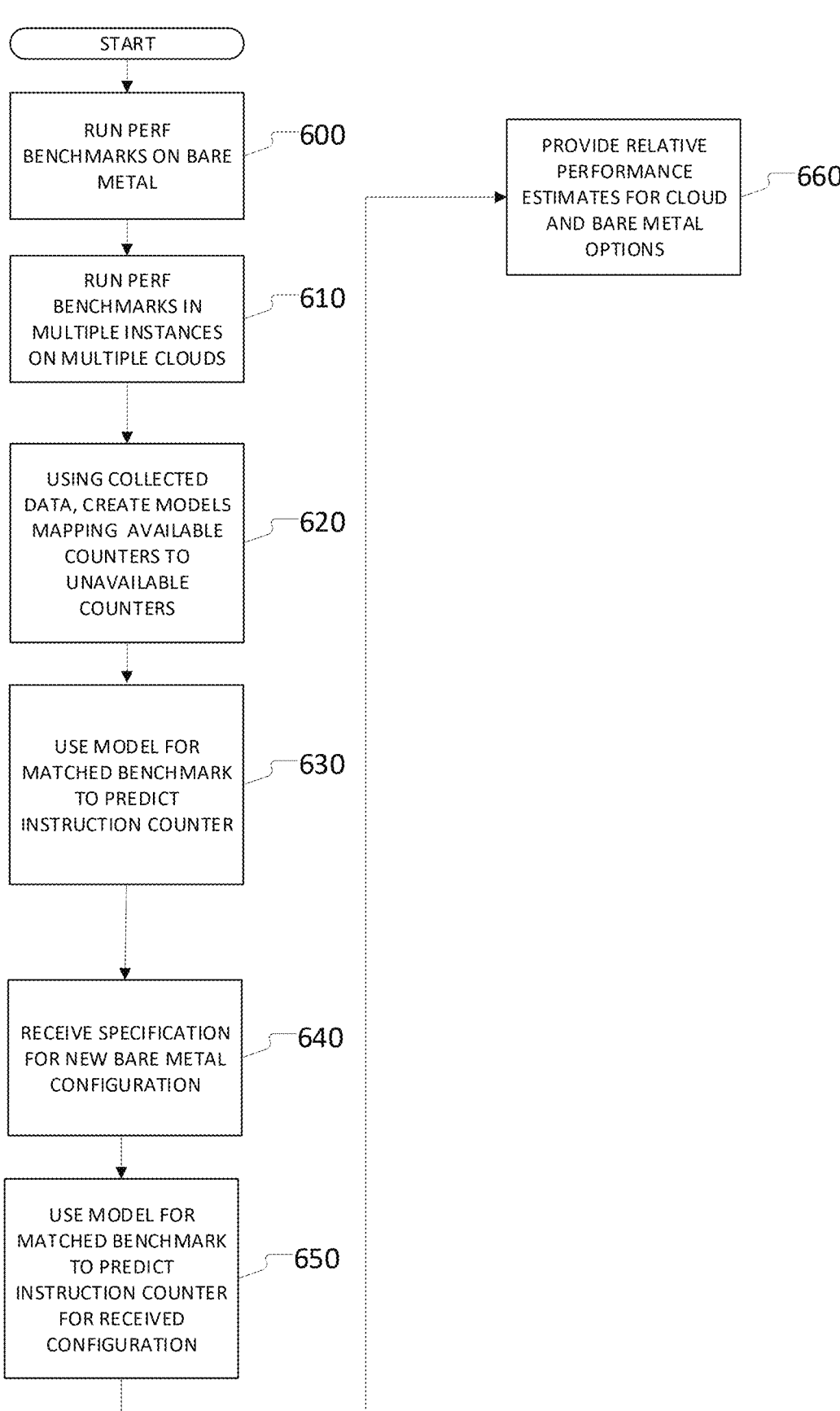
FIG. 6 is a flowchart of an example embodiment of a method for providing relative performance estimates for cloud and bare metal configurations.

Turning now to FIG. 6, a flowchart of an example embodiment of a method for providing relative performance estimates for cloud and bare metal configurations is shown. In this embodiment, given a cloud performance benchmark, a prediction model is created to predict performance of a bare metal platform relative to an existing cloud instance. This may be helpful for data scientists using a cloud instance and considering migrating their application to an on-premises bare metal system. As with prior examples, benchmarks are run on bare metal systems (step 600) and on multiple cloud instances on multiple different clouds (step 610). Data is collected and used to create models that map available counters on cloud systems to the desired but unavailable performance counters such as the instructions counter (step 620). The model is used to predict a performance counter for the user's existing cloud instance (step 630). Next, the user is prompted to specify the bare metal system they are considering (step 640). The user may for example, select the system from a list of already profiled bare metal systems, or provide data from the perf tool for one or more benchmarks (e.g., as provided by the system manufacturer). The model for the matched benchmark may then be used to predict an instruction counter (and relative performance value) for the specified bare metal configuration from the user (step 650). Based on these inputs, the relative performance of the cloud instance and bare metal systems may be presented to the user (step 660).

In one embodiment, the model may be created using linear regression analysis with a positive coefficients constraint. For example, let A be a matrix in which the columns store the values of the cycles, page-faults, context-switches, or any other available performance-related counter for shared instances that are related to the instructions counter. One additional column may be added that is filled with ones for the bias. Let B be a column vector which store the associated instructions gathered for the counters in matrix A at different time intervals for a specific application. A column vector x is then estimated which minimizes the squared error between Ax and b, subject to the components of x being positive (i.e., x (i)>0 for all i). This is shown in the formula below, wherein Matrix A represents a matrix with the observed counters available in the cloud, Vector y represents the instructions associated to those counters, and the x vector contains the coefficients that define the relationship between A and y:

$$\min\|Ax - y\|^2, \text{ subject to: } x_i \geq 0, \forall i$$

Figure 7:
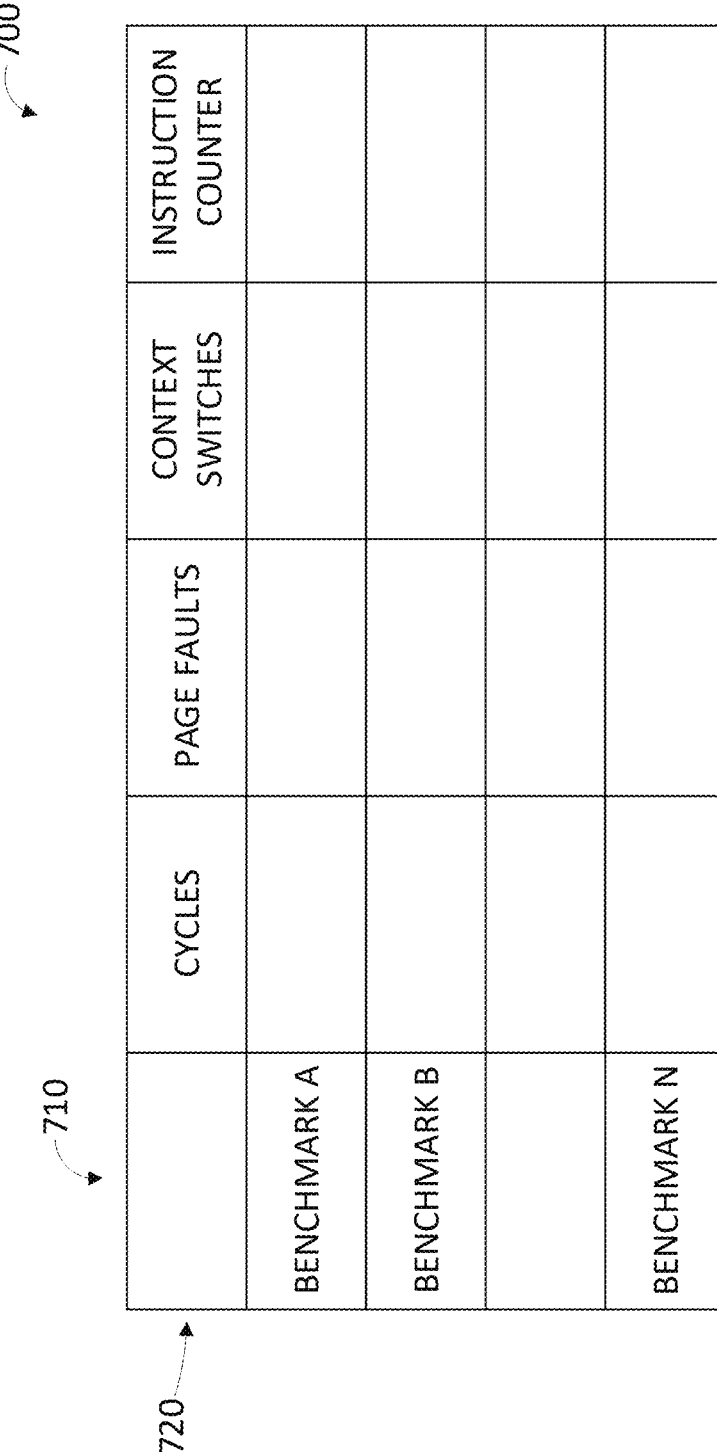
FIG. 7 is a diagram illustrating an example of a matrix usable for estimating performance for cloud and bare metal systems.

Turning now to FIG. 7, a diagram illustrating an example matrix 700 usable for estimating performance for cloud and bare metal systems is shown. While other matrix configurations are possible and contemplated, in this example, each row 720 stores data for a different benchmark (or different run if multiple runs per benchmark are available), as indicated by column 710. Each column stores the values gathered for a particular counter. In some embodiments, not all systems may be tested, but based on the existing data for similar tested instance configurations, predictions may still be made.

Reference throughout the specification to "various embodiments," "with embodiments," "in embodiments," or "an embodiment," or the like, means that a particular feature, structure, or characteristic described in connection with the embodiment is included in at least one embodiment. Thus, appearances of the phrases "in various embodiments," "with embodiments," "in embodiments," or "an embodiment," or the like, in places throughout the specification are not necessarily all referring to the same embodiment. Furthermore, the particular features, structures, or characteristics may be combined in any suitable manner in one or more embodiments. Thus, the particular features, structures, or characteristics illustrated or described in connection with one embodiment/example may be combined, in whole or in part, with the features, structures, functions, and/or characteristics of one or more other embodiments/examples without limitation given that such combination is not illogical or non-functional. Moreover, many modifications may be made to adapt a particular situation or material to the teachings of the present disclosure without departing from the scope thereof.

It should be understood that references to a single element are not necessarily so limited and may include one or more of such elements. Any directional references (e.g., plus, minus, upper, lower, upward, downward, left, right, leftward, rightward, top, bottom, above, below, vertical, horizontal, clockwise, and counterclockwise) are only used for identification purposes to aid the reader's understanding of the present disclosure, and do not create limitations, particularly as to the position, orientation, or use of embodiments.

Joinder references (e.g., attached, coupled, connected, and the like) are to be construed broadly and may include intermediate members between a connection of elements and relative movement between elements. As such, joinder references do not necessarily imply that two elements are directly connected/coupled and in fixed relation to each other. The use of "e.g." and "for example" in the specification is to be construed broadly and is used to provide non-limiting examples of embodiments of the disclosure, and the disclosure is not limited to such examples. Uses of "and" and "or" are to be construed broadly (e.g., to be treated as "and/or"). For example, and without limitation, uses of "and" do not necessarily require all elements or features listed, and uses of "or" are inclusive unless such a construction would be illogical.

While processes, systems, and methods may be described herein in connection with one or more steps in a particular sequence, it should be understood that such methods may be practiced with the steps in a different order, with certain steps performed simultaneously, with additional steps, and/or with certain described steps omitted.

All matter contained in the above description or shown in the accompanying drawings shall be interpreted as illustrative only and not limiting. Changes in detail or structure may be made without departing from the present disclosure.

It should be understood that a computer, a system, and/or a processor as described herein may include a conventional processing apparatus known in the art, which may be capable of executing preprogrammed instructions stored in an associated memory, all performing in accordance with the functionality described herein. To the extent that the methods described herein are embodied in software, the resulting software can be stored in an associated memory and can also constitute means for performing such methods. Such a system or processor may further be of the type having ROM, RAM, RAM and ROM, and/or a combination of non-volatile and volatile memory so that any software may be stored and yet allow storage and processing of dynamically produced data and/or signals.

It should be further understood that an article of manufacture in accordance with this disclosure may include a non-transitory computer-readable storage medium having a computer program encoded thereon for implementing logic and other functionality described herein. The computer program may include code to perform one or more of the methods disclosed herein. Such embodiments may be configured to execute via one or more processors, such as multiple processors that are integrated into a single system or are distributed over and connected together through a communications network, and the communications network may be wired and/or wireless. Code for implementing one or more of the features described in connection with one or more embodiments may, when executed by a processor, cause a plurality of transistors to change from a first state to a second state. A specific pattern of change (e.g., which transistors change state and which transistors do not), may be dictated, at least partially, by the logic and/or code.

What is claimed is:

1. A method for estimating performance on cloud computing systems, the method comprising:

executing a plurality of performance benchmarks on a plurality of cloud computing systems and bare metal computing systems to collect performance counter data, wherein the performance counter data comprises a set of available counters and one or more unavailable counters, wherein the one or more unavailable counters is a restricted-access performance counter;

creating a model for each of the plurality of performance benchmarks by identifying a statistical or machine-learned correlation between the set of available counters and the one or more unavailable counters using the performance counter data collected from execution of the plurality of performance benchmarks on the plurality of cloud computing systems and bare metal computing systems;

matching an application to be modeled with one of the plurality of performance benchmarks, in response to receiving the performance counter data for the application;

predicting at least one unavailable counter of the one or more unavailable counters for the application based on the model created for the matched performance benchmark, in response to matching the application with the performance benchmark;

deploying a recommended cloud computing system configuration for the application and executing the application, the recommended cloud computing system based on the predicted at least one unavailable counter to optimize application performance or cost, in response to predicting the at least one unavailable counter of the one or more unavailable counters; and wherein the model created for the matched performance benchmark is configured to receive, as input, the performance counter data for the application collected from a cloud computing system, and to output the predicted at least one unavailable counter based on the statistical or machine-learned correlations derived from prior benchmark executions including both the cloud and the bare metal computing systems.

2. The method of claim 1, further comprising populating a matrix based on the collected performance counter data, wherein the model for each of the plurality of performance benchmarks is a vector.

3. The method of claim 2, further comprising updating the matrix with additional data gathered from executing applications on one or more of the plurality of cloud computing systems.

4. The method of claim 2, wherein the matrix has columns, wherein one or more of the columns of the matrix stores values for performance counters comprising cycles, page-faults, and context-switches.

5. The method of claim 1, wherein the matching is performed using normalized histograms of performance counters.

6. The method of claim 1, wherein the model for each of the plurality of performance benchmarks is a regression model based on linear regression with a positive coefficients constraint.

7. The method of claim 1, wherein the one or more unavailable counters comprise an instructions counter.

8. The method of claim 1, wherein predicting at least one unavailable counter is based on a positive and linear relationship between the set of available counters and the one or more unavailable counters.

9. The method of claim 1, further comprising calculating a predicted relative performance between different cloud instances on different clouds for the application.

10. A system having at least one processor, the system configured to:

execute a plurality of performance benchmarks on a plurality of cloud computing systems and bare metal computing systems to collect performance counter data, wherein the performance counter data comprises a set of available counters and one or more unavailable counters, wherein the one or more unavailable counters is a restricted-access performance counter;

create a model for each of the plurality of performance benchmarks by identifying a statistical or machine-learned correlation between the set of available counters and the one or more unavailable counters in the collected performance counter data, in response to determining that the performance counter data for both the available counters and the one or more unavailable counters has been collected for that performance benchmark;

match an application to be modeled with one of the plurality of performance benchmarks, in response to receiving the performance counter data for the application;

predict at least one unavailable counter of the one or more unavailable counters for the application based on the model created for the matched performance benchmark, in response to matching the application with the performance benchmark;

deploy a recommended cloud computing system configuration for the application and execute the application, the recommended cloud computing system configuration based on the predicted at least one unavailable counter to optimize application performance or cost, in response to predicting the at least one unavailable counter of the one or more unavailable counters; and wherein the model created for the matched performance benchmark is configured to receive, as input, the performance counter data for the application collected from a cloud computing system, and to output the predicted at least one unavailable counter based on the statistical or machine-learned correlations derived from prior benchmark executions including both the cloud and the bare metal computing systems.

11. The system of claim 10, further configured to populate a matrix based on the collected performance counter data, wherein the model for each of the plurality of performance benchmarks is a vector.

12. The system of claim 11, further configured to update the matrix with additional data gathered from executing applications on one or more of the plurality of cloud computing systems.

13. The system of claim 11, wherein the matrix has columns, wherein one or more of the columns of the matrix stores values for performance counters comprising cycles, page-faults, and context-switches.

14. The system of claim 10, wherein the match is performed using normalized histograms of performance counters.

15. The system of claim 10, wherein the model for each of the plurality of performance benchmarks is a regression model based on linear regression with a positive coefficients constraint.

16. The system of claim 10, wherein the one or more unavailable counters comprise an instructions counter.

17. A system for estimating application performance comprising:

a memory including computer readable instructions;

at least one processor configured to execute the computer readable instructions to:

collect performance counter data from test runs of a plurality of performance benchmarks on a plurality of cloud computing systems, wherein the performance counter data comprises a set of available counters and one or more unavailable counters, wherein the one or more unavailable counters is a restricted-access performance counter;

create a model for each of the plurality of performance benchmarks based on an observed relationship between the set of available counters and the one or more unavailable counters in the collected performance counter data, in response to determining that the performance counter data for both the available counters and the one or more unavailable counters has been collected for that performance benchmark;

match an application to be modeled with one of the plurality of performance benchmarks, in response to receiving the performance counter data for the application;

predict at least one unavailable counter of the one or more unavailable counters for the application based on the model created for the matched performance benchmark's model, in response to matching the application with the performance benchmark;

deploy, in response to predicting the at least one unavailable counter of the one or more unavailable counters, a recommended cloud computing system configuration for the application and execute the application, the recommended cloud computing system configuration corresponds to a configuration that satisfies one or more optimization criteria including performance, cost, or equivalence to a reference computing system based on a comparison of the predicted performance across a plurality of cloud computing system configurations.

18. The system of claim 17, wherein the at least one processor is further configured to use normalized histograms of the performance counter data to match the application to be modeled with one of the plurality of performance benchmarks.

19. The system of claim 17, wherein the model for each of the plurality of performance benchmarks is a regression model based on linear regression with a positive coefficients constraint.

20. The system of claim 17, wherein the one or more unavailable counters comprise an instructions counter.

21. A method for comparing performance of bare metal and non-bare metal systems, the method comprising:

building a training set by gathering performance data by running one or more performance benchmarks on multiple bare metal and cloud instances that permit access to available performance counters;

creating a regression model trained with the gathered performance data to learn a mapping between the available performance counters and one or more unavailable performance counters, in response to determining that the training set includes performance data for both the available performance counters and the one or more unavailable counters, wherein the one or more unavailable counters is a restricted-access performance counter;

inferring, using the regression model, an unavailable performance counter of the one or more unavailable counters for a new cloud instance, in response to receiving performance counter data for the new cloud instance;

comparing, in response to inferring the unavailable performance counter for the new cloud instance, an inferred unavailable performance counter value for the new cloud instance with corresponding measured values obtained from prior executions of the one or more performance benchmarks on the bare metal instances to estimate a relative performance difference between the cloud instances and bare metal configurations of the bare metal instances for the same benchmark or application;

recommending, in response to and based on the estimated relative performance difference, a cloud configuration that approximates the performance of a corresponding bare metal configuration or optimizes the cloud configuration for a selected performance metric; and deploying the recommended cloud configuration and executing the application thereon.

* * * * *